United States Patent
Zhang et al.

(10) Patent No.: US 12,048,103 B2
(45) Date of Patent: Jul. 23, 2024

(54) ARC-SHAPED LOCK AND SPLICING SCREEN

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Haijun Zhang, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/789,782

(22) PCT Filed: May 18, 2022

(86) PCT No.: PCT/CN2022/093516
§ 371 (c)(1),
(2) Date: Jun. 28, 2022

(87) PCT Pub. No.: WO2023/040316
PCT Pub. Date: Mar. 23, 2023

(65) Prior Publication Data
US 2024/0196547 A1  Jun. 13, 2024

(30) Foreign Application Priority Data
Sep. 17, 2021 (CN) .......................... 202111094981.7

(51) Int. Cl.
*H05K 5/00* (2006.01)
*F16B 5/02* (2006.01)

(52) U.S. Cl.
CPC ......... *H05K 5/0021* (2013.01); *F16B 5/0233* (2013.01)

(58) Field of Classification Search
CPC ........................... H05K 5/0021; F16B 5/0233
See application file for complete search history.

(56) References Cited

U.S. PATENT DOCUMENTS

| 8,632,042 B2 * | 1/2014 | Hoel | ...................... F16M 11/10 |
| | | | 248/371 |
| 9,016,645 B2 * | 4/2015 | Simpson | ................ H04R 1/026 |
| | | | 248/292.12 |

(Continued)

FOREIGN PATENT DOCUMENTS

| CN | 205845429 U | 12/2016 |
| CN | 206130452 U | 4/2017 |

(Continued)

*Primary Examiner* — Anthony Q Edwards
*Assistant Examiner* — Hung Q Dang

(57) ABSTRACT

In order to overcome the problems that the existing arc-shaped lock has a complex structure and is difficult to accurately adjust angles, the application provides an arc-shaped lock, comprising an angle control mechanism and a locking mechanism; the angle control mechanism comprises a first mounting structure and a first sliding mechanism, a second sliding mechanism and a positioning mechanism, and the first mounting structure is used for installing a display module; the locking mechanism comprises a second mounting structure, and the second mounting structure is used for installing another display module; the first sliding mechanism and the second sliding mechanism telescopically extend out of the first mounting structure and abut against the second mounting structure, the positioning mechanism is used for positioning lengths of the first sliding mechanism and the second sliding mechanism extending out of the first mounting structure; and the first sliding mechanism and second sliding mechanism are positioned at two sides of the lock bar. According to the arc-shaped lock provided by the application, the angle of the first mounting structure and the second mounting structure can be adjusted by the length (Continued)

difference between the first sliding mechanism and the second sliding mechanism at two sides of the lock bar, so that the angle between display modules can be adjusted; and the arc-shaped lock has a simple structure and allows precise adjustment of the curvature.

18 Claims, 4 Drawing Sheets

(56) References Cited

U.S. PATENT DOCUMENTS

| | | | |
|---|---|---|---|
| 10,344,911 B2 * | 7/2019 | Mills | F16M 11/2014 |
| 10,995,787 B2 * | 5/2021 | Cai | G09F 9/3026 |
| 11,269,384 B2 * | 3/2022 | Zhang | F16M 11/08 |
| 11,781,582 B2 * | 10/2023 | Zhang | F16C 11/10 |
| | | | 403/349 |
| 11,933,450 B2 * | 3/2024 | Lau | F16M 11/2021 |

FOREIGN PATENT DOCUMENTS

| | | | | |
|---|---|---|---|---|
| CN | 107393427 A | | 11/2017 | |
| CN | 207367529 U | | 5/2018 | |
| CN | 110173490 A | | 8/2019 | |
| CN | 113066387 | * | 2/2021 | H05K 5/0021 |
| CN | 213018403 U | | 4/2021 | |
| CN | 113066387 A | | 7/2021 | |

\* cited by examiner

ARC-SHAPED LOCK AND SPLICING SCREEN

TECHNICAL FIELD

The application belongs to the technical field of LED display screens, and particularly relates to an arc-shaped lock and a splicing screen.

BACKGROUND

With the development of LED display technology, its application fields are more and more extensive, and the development trend of LED display industry is high-density, multi-shapes, and requires convenient and fast installation. High-density means that a large screen is needed, and multi-shapes means that the shape of the whole LED display would be varied according to the needs. Because the large-screen LED display is difficult to carry, the existing method generally combines a plurality of small LED displays to form a large-screen LED display, and each small LED display includes a frame and an LED display module installed on one side of the frame. When assembling, the frames are spliced together. In the prior art, most of the spliced frames are on the same plane, that is, spliced into a flat plane. However, in certain application scenarios, for example, when the overall display effect of LED display screen is required to be curved, angle splicing (also called arc splicing) should be considered. Angle splicing is basically done by angle locking devices or arc-shaped locks. A slot of the arc-shaped lock is provided on the box, and the arc-shaped lock is placed in the slot of the arc-shaped lock to connect the two boxes into an arc shape.

The existing arc-shaped locks mostly adopt an arc-shaped guide groove structure, which is locked after being adjusted to a required angle in an arc-shaped track by an adjusting block or positioned by a positioning marble. This solution not only makes the volume large, but also is often limited by angle adjustment, and the angle cannot be adjusted adaptively. There are also some arc-shaped locks with multi-angle adjustment, but those arc-shaped locks have no mechanism to accurately limit the angles, which leads to large angle clamping deviation, thus affecting the overall assembly and display effects.

SUMMARY

Aiming at the problems that the existing arc-shaped lock has a complex structure and is difficult to accurately adjust angles, the application provides an arc-shaped lock and a splicing screen.

The technical solutions adopted by the application to solve the technical problems are as follows.

In one aspect, the present application provides an arc-shaped lock, comprising an angle control mechanism and a locking mechanism;

the angle control mechanism comprises a first mounting structure and a first sliding mechanism, a second sliding mechanism and a positioning mechanism arranged on the first mounting structure, and the first mounting structure is used for installing a display module;

the locking mechanism comprises a second mounting structure, and the second mounting structure is used for installing another display module;

the first mounting structure and the second mounting structure are arranged adjacent to each other, the first sliding mechanism and the second sliding mechanism are capable to telescopically extend out of the first mounting structure and abut against the second mounting structure, the positioning mechanism is used for positioning lengths of the first sliding mechanism and the second sliding mechanism extending out of the first mounting structure; and the first mounting structure and the second mounting structure are locked or unlocked by arranging a lock bar and a limit mechanism, and the first sliding mechanism and the second sliding mechanism are positioned at two sides of the lock bar.

Optionally, the first mounting structure comprises a mounting base and a housing, and the housing is fixedly connected with the mounting base, the mounting base has a first mounting surface and a first contact surface, and the first mounting surface is used for mounting a display module, the first contact surface is provided with a first through hole and a second through hole, the first sliding mechanism penetrates the first through hole, and the second sliding mechanism penetrates the second through hole; and the second mounting structure comprises a base, the base has a second mounting surface and a second contact surface, and the second mounting surface is used for mounting another display module, the lock bar is slidably connected with the base, and when the lock bar and the limit mechanism are locked with each other, the first sliding mechanism and the second sliding mechanism abut against the second contact surface to lock and fix the angle control mechanism and the locking mechanism.

Optionally, the positioning mechanism comprises a knob, an upper cam, a rotating shaft and a lower cam, one end of the rotating shaft is fixedly connected with the upper cam and the knob, the rotating shaft is inserted in the housing, another end of the rotating shaft is fixedly connected with the lower cam and rotationally connected with the mounting base, and the upper cam and the lower cam are in a sector structure, peripheries of the upper cam and the lower cam have an irregular groove, an end of the first sliding mechanism abuts against the periphery of the upper cam, and an end of the second sliding mechanism abuts against the periphery of the lower cam, the knob is provided with angle labels, and an outer surface of the housing is provided with an angle indicator at a position corresponding to the knob.

Optionally, the first sliding mechanism comprises a first top cover, a first slide bar and a first bottom cover, the first top cover and the first bottom cover are respectively fixed at an end of the first slide bar, and the first sliding mechanism is movably arranged in the housing;

the second sliding mechanism comprises a second top cover, a second slide bar and a second bottom cover, the second top cover and the second bottom cover are respectively fixed at an end of the second slide bar, and the second sliding mechanism is movably arranged in the housing; and the positioning mechanism is used for driving the first slide bar and the second slide bar to move relative to the mounting base, making the end of the first slide bar away from or close to the first contact surface and the end of the second slide bar away from or close to the first contact surface to adjust an angle between the first mounting surface and the second mounting surface.

Optionally, the first sliding mechanism further comprises a first spring, and the second sliding mechanism further comprises a second spring, the first spring is arranged between the first contact surface of the mounting base and the first top cover and/or the first bottom cover, and the first spring is used for connecting the first sliding mechanism with the upper cam without gap; and the second spring is arranged between the first contact surface of the mounting base and the second top cover and/or the second bottom cover, and the second spring is used for connecting the second sliding mechanism with the lower cam without gap.

Optionally, the limit mechanism comprises a limit block, an arc adjusting block and a third spring, the arc adjusting block is arranged between the housing and the mounting base, and the limit block is arranged between the housing and the arc adjusting block, the third spring is arranged between the mounting base and the limit block, and the third spring provides a driving force for the limit block to move in a direction of the lock bar, so that the limit block locks the lock bar.

Optionally, the locking mechanism further comprises a fixing piece, and the lock bar is provided with a hollow part penetrating through the lock bar, and the length of the hollow part is larger than the width of the fixing piece, the fixing piece penetrates the hollow part and slidably connects the lock bar to the base, the base is provided with a third through hole for the lock bar to penetrate, and the lock bar is capable to move back and forth relative to the base.

Optionally, the locking mechanism further comprises a handle and a fourth spring, one end of the lock bar is provided with grooves distributed at intervals, and another end of the lock bar is provided with a thread, the handle is rotationally connected with the lock bar through threads, the fourth spring is sleeved on the lock bar and arranged between the handle and the base, a fourth through hole is further arranged between the first through hole and the second through hole, and the fourth through hole is used for the lock bar to penetrate into the angle control mechanism.

Optionally, the angle control mechanism further comprises a limit block control piece, the limit block control piece has an L-shaped structure, and the limit block control piece passes through the housing and is located above the limit block.

In another aspect, that application further provides a splicing screen, including at least two LED display modules and the arc-shaped lock described above, the angle control mechanism is connected with one LED display module, the locking mechanism is connected with another adjacent LED display module, and the angle control mechanism is fixedly connected with the locking mechanism.

Compared with the prior art, the arc-shaped lock has the beneficial effects that: the positioning mechanism controls the lengths of the first sliding mechanism and the second sliding mechanism extending out of the first mounting structure, thus there is a length difference between the first sliding mechanism and the second sliding mechanism on the two sides of the lock bar. Then, by using the lock bar and the limit mechanism together, the ends of the first sliding mechanism and the second sliding mechanism can be abutted against the second mounting structure, so that the angle of the first mounting structure and the second mounting structure is adjusted, and the angle adjustment between the display modules is realized. The arc-shaped lock is simple in structure, easy to use and operate. The positioning mechanism can accurately change the moving distances of the first sliding mechanism and the second sliding mechanism, so as to accurately control the curvature of the splicing screen; the lock bar and the limit mechanism can be locked or unlocked with each other, which facilitates the assembly and disassembly of the display module and improves the installation quality and efficiency of the splicing screen.

Figure 1:
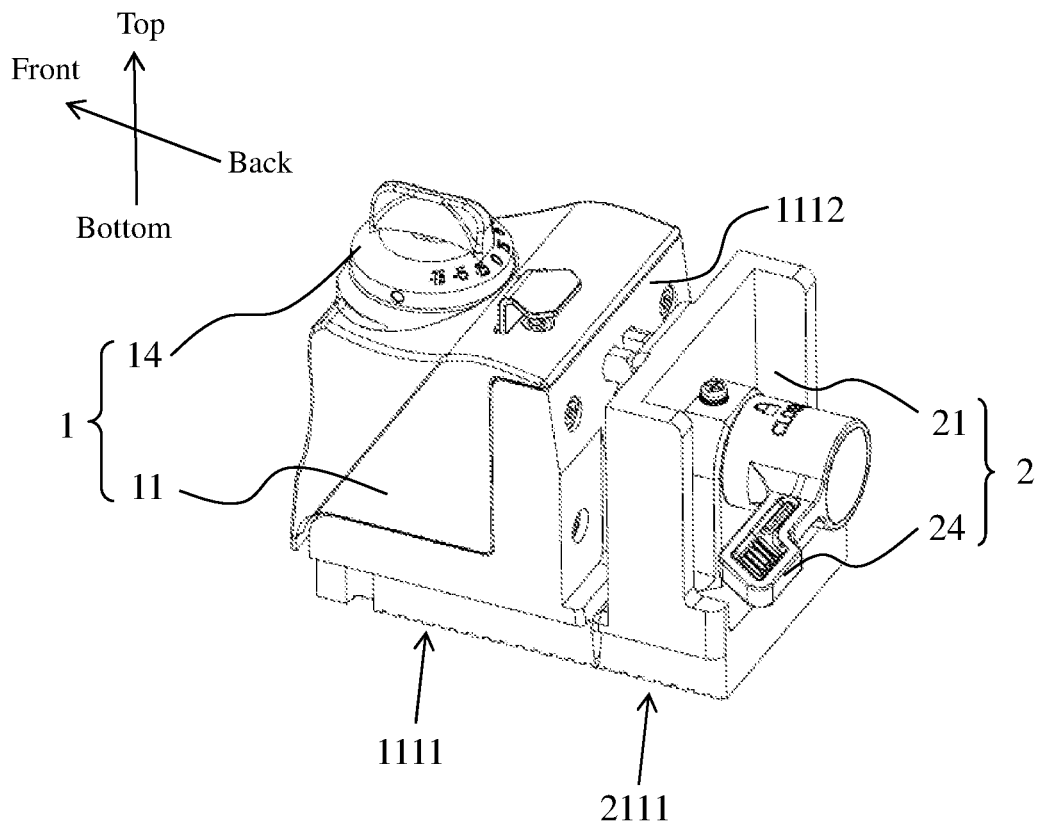
FIG. 1 is a structural schematic diagram of an arc-shaped lock provided by an embodiment of the present application.
Figure 2:
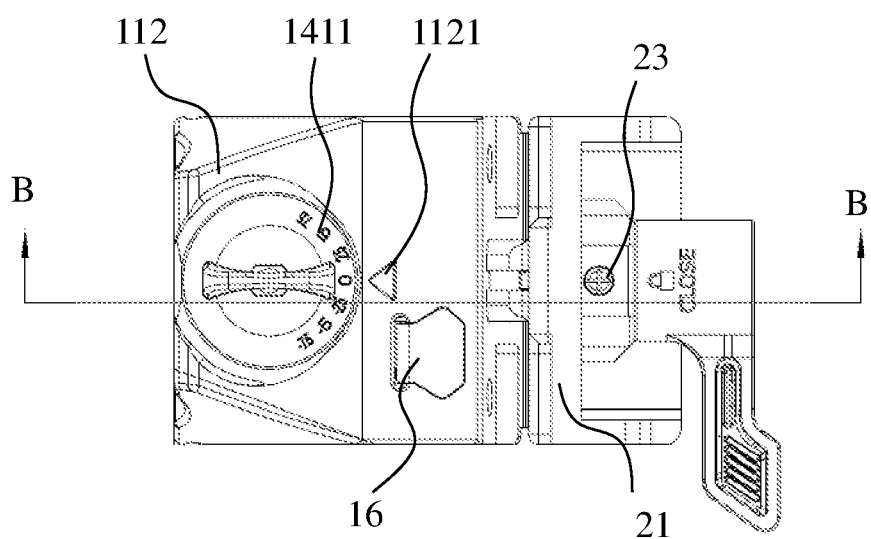
FIG. 2 is a top view of the arc-shaped lock shown in FIG. 1.

The reference signs in the figures are as follows:
1. Angle control mechanism; 11. First mounting structure; 111. Mounting base; 1111. First mounting surface; 1112. First contact surface; 1113. First through hole; 1114. Second through hole; 1115. Fourth through hole; 112. Housing; 1121. Angle indicator;
12. First sliding mechanism; 121. First top cover; 122. First slide bar; 123. First bottom cover; 124. First spring;
13. Second sliding mechanism; 131. Second top cover; 132. Second slide bar; 133. Second bottom cover; 134. Second spring;
14. Positioning mechanism; 141. Knob; 1411. Angle label; 142. Upper cam; 143. Rotating shaft; 144. Lower cam;
15. Limit mechanism; 151. Limit block; 1511. Convex part; 152. Arc adjusting block; 153. Third spring; 16. Limit block control piece;
2. Locking mechanism; 21. Second mounting structure; 211. Base; 2111. Second mounting surface; 2112. Second contact surface; 2113. Third through hole; 22. Lock bar; 221. Groove; 222. Hollow part; 23. fixing piece; 24. Handle; 25. Fourth spring.

DETAILED DESCRIPTION OF DISCLOSED EMBODIMENTS

In order to make the technical problems, technical solutions and beneficial effects of the present application clearer, the present application will be further explained in detail with reference to the drawings and embodiments. It should be understood that the specific embodiments described here are only for illustrating the present application, not limiting the present application.

It should be noted that all directional indications (such as below, front and back, . . . ) in the embodiment of the present application are only used to illustrate the relative positional relationships, movement states, etc. of the structures in a specific state (as shown in the drawings). If the specific state changes, the directional indications would also change accordingly.

In addition, the terms of "first", "second", etc. in the present application are only used for descriptive purposes, and cannot be understood as indicating or implying their relative importance or implicitly indicating the number of indicated technical features.

Referring to FIGS. 1-8, an embodiment of the present application provides an arc-shaped lock, which includes an angle control mechanism 1 and a locking mechanism 2;

the angle control mechanism 1 comprises a first mounting structure 11 and a first sliding mechanism 12, a second sliding mechanism 13 and a positioning mechanism 14 arranged on the first mounting structure 11, and the first mounting structure 11 is used for installing a display module;

the locking mechanism 2 comprises a second mounting structure 21, and the second mounting structure 21 is used for installing another display module;

the first mounting structure 11 and the second mounting structure 21 are arranged adjacent to each other, the first sliding mechanism 12 and the second sliding mechanism 13 are capable to telescopically extend out of the first mounting structure 11 and abut against the second mounting structure 21, the positioning mechanism 14 is used for positioning lengths of the first sliding mechanism 12 and the second sliding mechanism 13 extending out of the first mounting structure 11; and the first mounting structure 11 and the second mounting structure 21 are locked or unlocked by arranging a lock bar 22 and a limit mechanism 15, and the first sliding mechanism 12 and the second sliding mechanism 13 are positioned at two sides of the lock bar 22.

According to the arc-shaped lock provided by the present application, the positioning mechanism 14 controls the lengths of the first sliding mechanism 12 and the second sliding mechanism 13 extending out of the first mounting structure 11, thus there is a length difference between the first sliding mechanism 12 and the second sliding mechanism 13 on the two sides of the lock bar 22. Then, by using the lock bar 22 and the limit mechanism 15 together, the ends of the first sliding mechanism 12 and the second sliding mechanism 13 can be abutted against the second mounting structure 21, so that the angle of the first mounting structure 11 and the second mounting structure 21 is adjusted, and the angle adjustment between the display modules is realized. The arc-shaped lock is simple in structure, easy to use and operate. The positioning mechanism 14 can accurately change the moving distances of the first sliding mechanism 12 and the second sliding mechanism 13, so as to accurately control the curvature of the splicing screen; the lock bar 22 and the limit mechanism 15 can be locked or unlocked with each other, which facilitates the assembly and disassembly of the display module and improves the installation quality and efficiency of the splicing screen.

In some embodiments, the first mounting structure 11 includes a mounting base 111 and a housing 112, and the mounting base 111 is fixedly connected with the housing 112, the mounting base 111 has a first mounting surface 1111 and a first contact surface 1112, and the first mounting surface 1111 is used for mounting a display module; the first contact surface 1112 is provided with a first through hole 1113 and a second through hole 1114, the first sliding mechanism 12 can penetrate the first through hole 1113, and the second sliding mechanism 13 can penetrate the second through hole 1114;

the second mounting structure 21 comprises a base 211, the base 211 has a second mounting surface 2111 and a second contact surface 2112, and the second mounting surface 2112 is used for mounting another display module, the lock bar 22 is slidably connected with the base 211, and when the lock bar 22 and the limit mechanism 15 are locked with each other, the first sliding mechanism 12 and the second sliding mecha- nism 13 abut against the second contact surface 2112 to lock and fix the angle control mechanism 1 and the locking mechanism 2.

In the installation process, the first mounting surface 1111 of angle control mechanism 1 and the second mounting surface 2111 of locking mechanism 2 are respectively fixed on two adjacent LED display unit frames. The positioning mechanism 14 drives the first sliding mechanism 12 and the second sliding mechanism 13 to move different distances, then, the lock bar 22 of the locking mechanism 2 is inserted into the angle control mechanism 1, and the lock bar 22 is rotated to adjust the gap between the lock bar 22 and the limit mechanism 15, so that the second contact surface 2112 of the locking mechanism 2 is tightly attached to the ends of the first sliding mechanism 12 and the second sliding mechanism 13. At this time, the angle control mechanism 1 and the locking mechanism 2 are locked with each other, so that two adjacent LED display modules are temporarily fixed at a required angle and spliced into an arc-shaped LED display screen.

In some embodiments, the positioning mechanism 14 includes a knob 141, an upper cam 142, a rotating shaft 143 and a lower cam 144, one end of the rotating shaft 143 is fixedly connected with the upper cam 142 and the knob 141; the rotating shaft 143 is inserted into the housing 112, and the other end of the rotating shaft 143 is fixedly connected with the lower cam 144 and rotationally connected with the mounting base 111. The upper cam 142 and the lower cam 144 have a sector structure, outer peripheries of the upper cam 142 and the lower cam 144 have an irregular groove, and the end of the first sliding mechanism 12 abuts against the outer periphery of the upper cam 142; the end of the second sliding mechanism 13 abuts against the outer periphery of the lower cam 144; the knob 141 is provided with an angle label 1411, and the outer surface of the housing 112 is provided with an angle indicator 1121 at a position corresponding to the knob 141.

When the knob 141 rotates under the action of external force, it drives the upper cam 142, the rotating shaft 143 and the lower cam 144 to rotate, so that the first sliding mechanism 12 and the second sliding mechanism 13 move different distances relative to the first contact surface 1112.

The upper cam 142 is slidably connected with the end of the first sliding mechanism 12, and the outer periphery of the upper cam 142 has an irregular groove, and the first sliding mechanism 12 can slide relative to the outer periphery of the upper cam 142 when the knob 141 rotates. When the rotation angle is different, the connection position between the first sliding mechanism 12 and the outer periphery of the upper cam 142 is different. The outer edge of the upper cam 142 has an irregular groove structure, therefore the distances between different points on the outer periphery of the upper cam 142 and the rotating shaft 143 are different. By changing the rotation angle of the knob 141, the connection position between the first sliding mechanism 12 and the periphery of the upper cam 142 can be changed, and then the distance between the end of the first sliding mechanism 12 and the rotating shaft 143 can be changed. Finally, the moving distance of the first sliding mechanism 12 is changed, so that the first sliding mechanism 12 extends out or retracts to the first contact surface 1112. According to the same principle, the rotation of the lower cam 144 can change the moving distance of the second sliding mechanism 13. By appropriately designing the sizes and shapes of the upper cam 142 and the lower cam 144, i.e., the distance that the first sliding mechanism 12 moves relative to the first contact surface 1112 is different from the distance that the second sliding mechanism 13 moves relative to the first contact surface 1112, the angle of the first mounting structure 11 and the second mounting structure 21 can be adjusted, thereby the angle between the display modules can be adjusted. In this way, the convenience and accuracy of the curvature adjustment of the LED display screen are improved.

The knob 141, upper cam 142, rotating shaft 143 and lower cam 144 are fixedly connected, and the upper cam 142, rotating shaft 143 and lower cam 144 can be indirectly driven to rotate by rotating the knob 141. In this way, the accuracy of the rotation angles of the upper cam 142 and the lower cam 144 is ensured, and the accuracies of the moving distances of the first sliding mechanism 12 and the second sliding mechanism 13 are further realized, thus the accuracy of the installation angle of the arc-shaped LED display screen is achieved.

The angle label 1411 and angle indicator 1121 can visually show the splicing angle of two adjacent LED displays to users, which is convenient to adjust the radian of LED displays.

Further, the angle label 1411 refers to the angle between the first mounting surface 1111 and the second mounting surface 2111 when the angle control mechanism 1 and the locking mechanism 2 are fixedly connected, and the angle label 1411 may optionally be 7.5°, 5°, 2.5°, 0°, −2.5°, −5° and −7.5°.

Assume that the angle between the first mounting surface 1111 and the second contact surface 2112 is A. The positioning mechanism 14 drives the first sliding mechanism 12 and the second sliding mechanism 13 to move different distances, and the included angle A can be arbitrarily changed, thus the included angle between the first mounting surface 1111 and the second mounting surface 2111 can be adjusted to any angle to meet the installation requirements of splicing screens with different radians. In order to explain it more clearly, the following three different included angles A are taken as examples.

Figure 3:
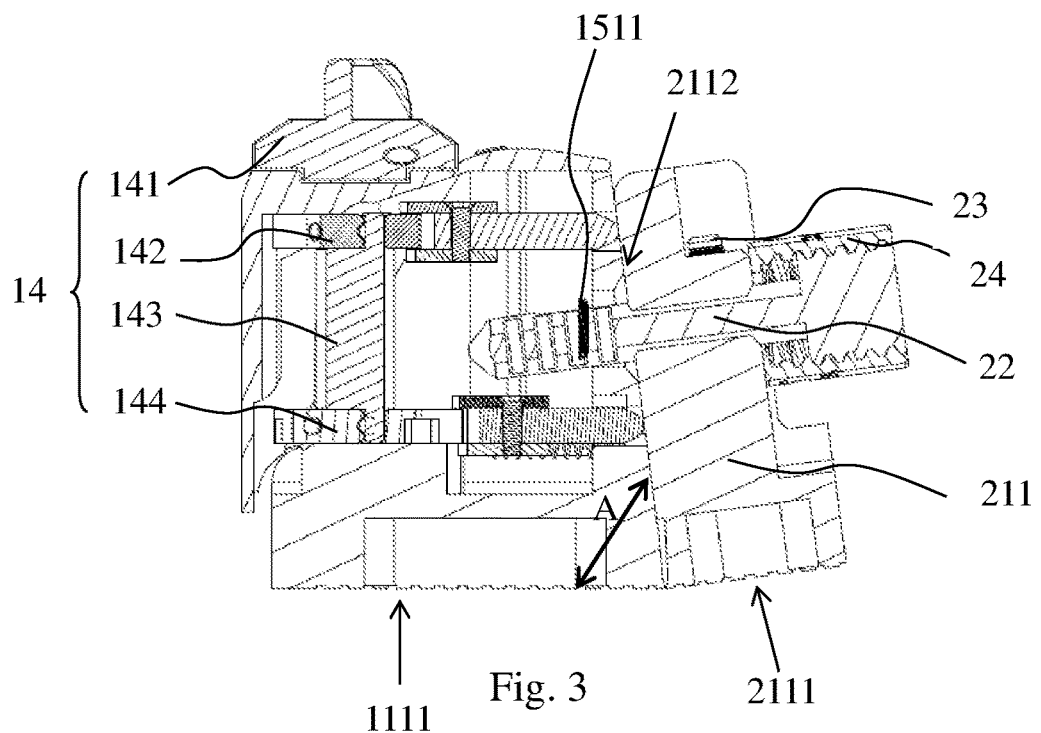
FIG. 3 is a cross-sectional view of the angle label at −7.5° of FIG. 2, taken along line B-B.

As shown in FIG. 3, when A is 82.5°, the included angle between the first mounting surface 1111 and the second mounting surface 2111 is −7.5°, and the angle label 1411 pointed by the angle indicator 1121 is −7.5°, i. e., the splicing angle of the two LED unit displays is −7.5°.

Figure 4:
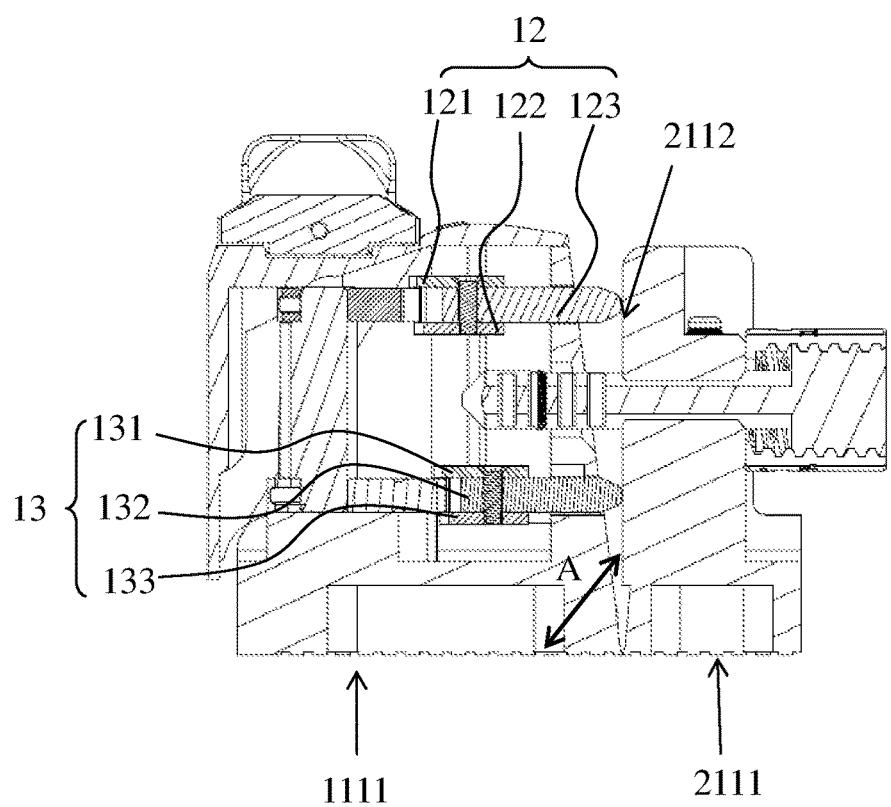
FIG. 4 is a cross-sectional view of the angle label at 0° of FIG. 2, taken along line B-B.

As shown in FIG. 4, when A is 90°, the included angle between the first mounting surface 1111 and the second mounting surface 2111 is 0°, and the angle label 1411 pointed by the angle indicator 1121 is 0°, i. e., the splicing angle of the two LED unit displays is 0°. In this case, the LED display is rectangular.

Figure 5:
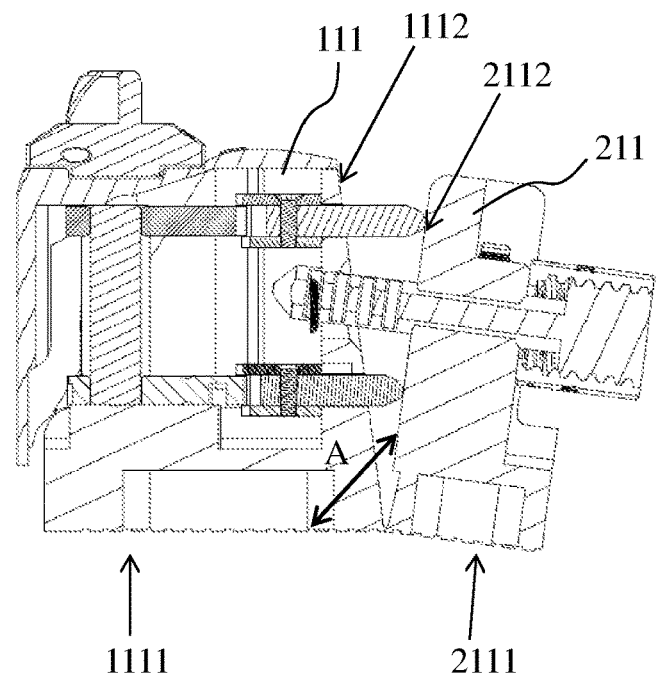
FIG. 5 is a cross-sectional view of the angle label at 7.5° of FIG. 2, taken along line B-B.
Figure 6:
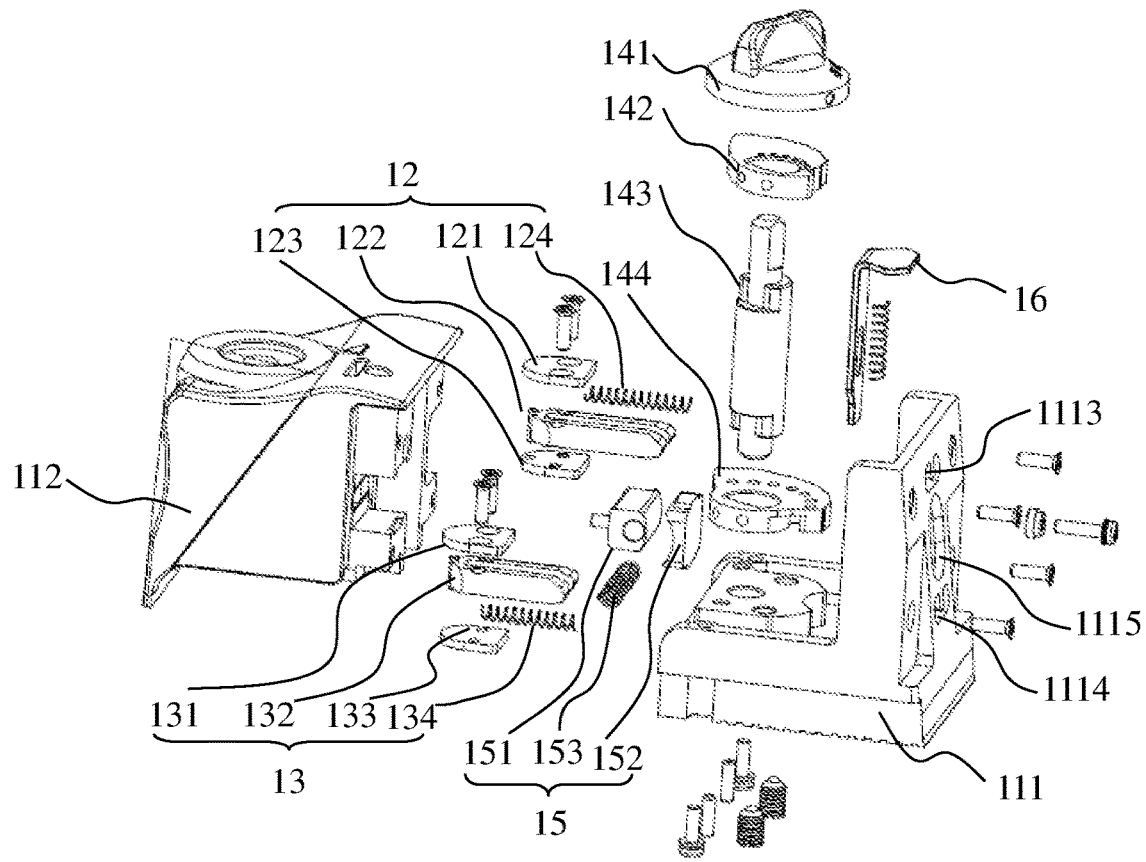
FIG. 6 is a structural schematic diagram of an angle control mechanism provided by an embodiment of the present application.

As shown in FIG. 5, when A is 97.5°, the included angle between the first mounting surface 1111 and the second mounting surface 2111 is 7.5°, and the angle label 1411 pointed by the angle indicator 1121 is 7.5°, i. e., the splicing angle of the two LED unit displays is 7.5°.

In some embodiments, the first sliding mechanism 12 includes a first top cover 121, a first slide bar 122 and a first bottom cover 123. The first top cover 121 and the first bottom cover 123 are respectively fixed at the ends of the first slide bar 122, and the first sliding mechanism 12 is movably arranged in the housing 112.

The second sliding mechanism 13 includes a second top cover 131, a second slide bar 132, and a second bottom cover 133. The second top cover 131 and the second bottom cover 133 are respectively fixed at the ends of the second slide bar 132, and the second sliding mechanism 13 is movably arranged in the housing 112.

The positioning mechanism 14 is used to drive the first slide bar 122 and the second slide bar 132 to move relative to the mounting base 111, so that the end of the first slide bar 122 is away from or close to the first contact surface 1112 and the end of the second slide bar 132 is away from or close to the first contact surface 1112, so as to adjust the included angle between the first mounting surface 1111 and the second mounting surface 2111.

Furthermore, the first slide bar 122 has a U-shaped structure, and the first slide bar 122 is provided with a fifth through hole through which a fixing piece passes. The first top cover 121 and the first bottom cover 123 are respectively fixed at the ends of the first slide bar 122, which can increase the stability of the first slide bar 122, avoid shaking, prevent the accuracy of radian adjustment from being affected, and reduce the weight of the arc-shaped lock.

Preferably, the first slide bar 122 and the second slide bar 132 have the same shape and size, which is conducive to accurately controlling the moving distance of the first sliding mechanism 12 and the second sliding mechanism 13, and increasing the reliability of the arc-shaped lock.

In some embodiments, the first sliding mechanism 12 further comprises a first spring 124, and the second sliding mechanism 13 further comprises a second spring 134, the first spring 124 is arranged between the first contact surface 1112 of the mounting base 111 and the first top cover 121 and/or the first bottom cover 123, and the first spring 124 is used for connecting the first sliding mechanism 12 with the upper cam 142 without gap.

The second spring 134 is arranged between the first contact surface 1112 of the mounting base 111 and the second top cover 131 and/or the second bottom cover 133, and the second spring 134 is used for connecting the second sliding mechanism 13 with the lower cam 144 without gap.

The first spring 124 provides the first sliding mechanism 12 with a driving force in the direction of the rotating shaft 143, so that the first sliding mechanism 12 is connected with the upper cam 142 without gap, and the first sliding mechanism 12 moves back and forth relative to the mounting base 111. Similarly, the second spring 134 provides the second sliding mechanism 13 with a driving force in the direction of the rotating shaft 143, so that the second sliding mechanism 13 is connected with the lower cam 144 without gap, and the second sliding mechanism 13 moves back and forth relative to the mounting base 111.

In some embodiments, the limit mechanism 15 includes a limit block 151, an arc adjusting block 152 and a third spring 153. The arc adjusting block 152 is disposed between the housing 112 and the mounting base 111, and the limit block 151 is disposed between the housing 112 and the arc adjusting block 152. The third spring 153 is disposed between the mounting base 111 and the limit block 151, and the third spring 153 provides the limit block 151 with a driving force to move in the direction of the lock bar 22, so that the limit block 151 locks the lock bar 22.

The limit block 151 has a convex part 1511 matched with the groove 221 on the lock bar 22, and the third spring 153 provides a driving force for the limit block 151 to move in the direction of the lock bar 22. Under the action of the driving force, the convex part 1511 of the limit block 151 is tightly embedded in the groove 221 of the lock bar 22, so that the angle control mechanism 1 and the locking mechanism 2 are locked with each other, and thus two adjacent LED unit displays are fixedly connected. The structure is simple, and the installation and maintenance are convenient.

Figure 7:
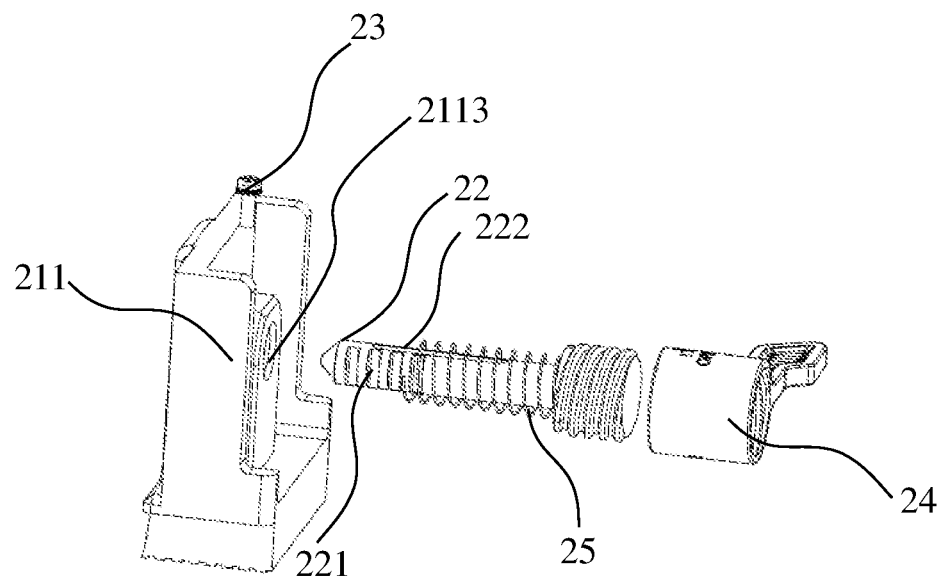
FIG. 7 is a structural schematic diagram of a locking mechanism provided by an embodiment of the present application.
Figure 8:
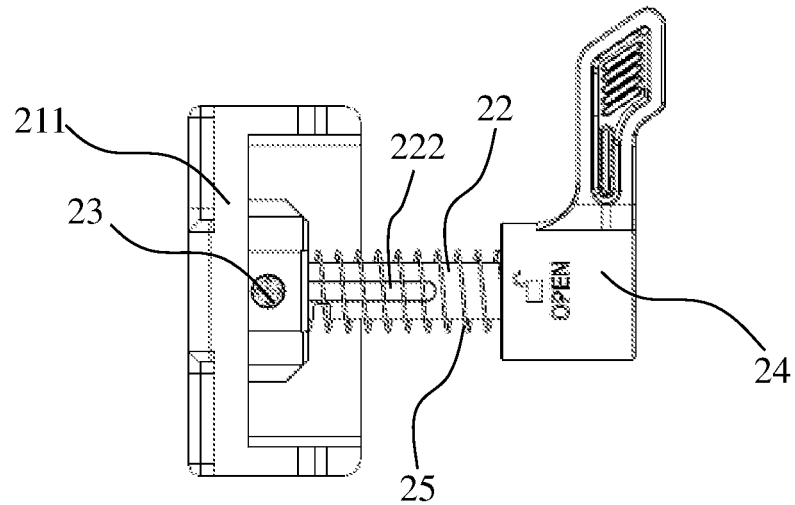
FIG. 8 is a top view of a locking mechanism provided by an embodiment of the present application.

Referring to FIGS. 7-8, in some embodiments, the locking mechanism 2 further comprises a fixing piece 23, and the locking bar 22 is provided with a hollow part 222 penetrating through the locking bar 22, and the length of the hollow part 222 is larger than the width of the fixing piece 23. The fixing piece 23 penetrates the hollow part 222 and slidably connects the lock bar 22 to the base 211. The base 211 has a third through hole 2113 for the lock bar 22 to penetrate, and the lock bar 22 can move back and forth relative to the base 211.

The fixing piece 23 is used for slidably connecting the lock bar 22 with the base 211, preventing the lock bar 22 from rotating under the action of external force, which would affect the locking function of the limit block 151 and the groove 221. The hollow part 222 has a rectangular structure. The length of the hollow part 222 is larger than the width of the fixing piece 23, so that the lock bar 22 can move back and forth with the fixing piece 23 as the axis. The fixing piece 23 may be a fixing piece used in the art, such as screws and pins, which is not particularly defined here.

In some embodiments, the locking mechanism 2 further comprises a handle 24 and a fourth spring 25, one end of the locking bar 22 is provided with grooves 221 distributed at intervals, and the other end of the locking bar 22 is provided with a thread, and the handle 24 is rotationally connected with the locking bar 22 through threads. The fourth spring 25 is sleeved on the lock bar 22 and arranged between the handle 24 and the base 211, and a fourth through hole 1115 is arranged between the first through hole 1113 and the second through hole 1114. The fourth through hole 1115 is used for the lock bar 22 to penetrate into the angle control mechanism 1.

The arrangement of the fourth spring 25 increases the stability of the locking mechanism 2, and the handle 24 is connected with the lock bar 22 through threads, so that the gap between the lock bar 22 and the limit block 151 can be adjusted by rotating the handle 24 under the action of external force, thus the locking mechanism 2 can be tightly attached to the angle control mechanism 1, which is beneficial to increase the installation stability and improve the splicing efficiency of the LED display screen.

In the installation process, when the handle 24 rotates anticlockwise under the action of external force, the lock bar 22 moves in the direction close to the angle control mechanism 1, thereby the second contact surface 2112 of the locking mechanism 2 is driven to approach the ends of the first sliding mechanism 12 and the second sliding mechanism 13. If the handle 24 cannot rotate, it indicates that the angle control mechanism 1 and the locking mechanism 2 are fixedly connected.

In some embodiments, the angle control mechanism 1 further comprises a limit block control piece 16 with an L-shaped structure, and the limit block control piece 16 passes through the housing 112 and is located above the limit block 16.

As described above, when the convex part 1511 is embedded in the groove 221, the angle control mechanism 1 and the locking mechanism 2 are fixedly connected and locked with each other to realize the installation of the splicing screen. However, when the splicing screen is disassembled, the angle control mechanism 1 needs to be separated from the locking mechanism 2, and the limit block control piece 16 moves downward under the action of external force. At this time, the limit block control piece 16 is embedded between the limit block 151 and the lock bar 22, so that the convex part 1511 pops out of the groove 221, that is, the locking of the lock bar 22 by the limit block 151 can be released so that the lock bar 22 can be pulled out of the angle control mechanism 1.

In the disassembly process of the splicing screen, when the handle 24 rotates clockwise under the action of an external force, the lock bar 22 moves in a direction away from the angle control mechanism 1, thereby the second contact surface 2112 of the locking mechanism 2 is driven away from the ends of the first sliding mechanism 12 and the second sliding mechanism 13. Press the limit block control piece 16 to pull the lock bar 22 out of the fourth through hole 1115, thereby releasing the temporary fixation of the angle control mechanism 1 and the locking mechanism 2.

In another aspect, an embodiment of the application further provides a splicing screen, including at least two LED display modules and the arc-shaped lock described above, the angle control mechanism is connected with one LED display module, the locking mechanism is connected with another adjacent LED display module, and the angle control mechanism is fixedly connected with the locking mechanism.

The above are only preferred embodiments of the present application, and not intended to limit the present application. Any modifications, equivalent substitutions and improvements made within the spirit and principle of the present application shall be included in the scope of protection of the present application.

What is claimed is:

1. An arc-shaped lock, comprising an angle control mechanism and a locking mechanism;
    wherein the angle control mechanism comprises a first mounting structure and a first sliding mechanism, a second sliding mechanism and a positioning mechanism arranged on the first mounting structure, and the first mounting structure is used for installing a display module;
    the locking mechanism comprises a second mounting structure, and the second mounting structure is used for installing another display module;
    the first mounting structure and the second mounting structure are arranged adjacent to each other, the first sliding mechanism and the second sliding mechanism are capable to telescopically extend out of the first mounting structure and abut against the second mounting structure, the positioning mechanism is used for positioning lengths of the first sliding mechanism and the second sliding mechanism extending out of the first mounting structure; and
    the first mounting structure and the second mounting structure are locked or unlocked by arranging a lock bar and a limit mechanism, and the first sliding mechanism and the second sliding mechanism are positioned at two sides of the lock bar.

2. The arc-shaped lock of claim 1, wherein the first mounting structure comprises a mounting base and a housing, and the housing is fixedly connected with the mounting base, the mounting base has a first mounting surface and a first contact surface, and the first mounting surface is used for mounting a display module, the first contact surface is provided with a first through hole and a second through hole, the first sliding mechanism penetrates the first through hole, and the second sliding mechanism penetrates the second through hole; and
    the second mounting structure comprises a base, the base has a second mounting surface and a second contact surface, and the second mounting surface is used for mounting another display module, the lock bar is slidably connected with the base, and when the lock bar and the limit mechanism are locked with each other, the first sliding mechanism and the second sliding mechanism abut against the second contact surface to lock and fix the angle control mechanism and the locking mechanism.

3. The arc-shaped lock of claim 2, wherein the positioning mechanism comprises a knob, an upper cam, a rotating shaft and a lower cam, one end of the rotating shaft is fixedly connected with the upper cam and the knob, the rotating shaft is inserted in the housing, another end of the rotating shaft is fixedly connected with the lower cam and rotationally connected with the mounting base, and the upper cam and the lower cam are in a sector structure, peripheries of the upper cam and the lower cam have an irregular groove, an end of the first sliding mechanism abuts against the periphery of the upper cam, and an end of the second sliding mechanism abuts against the periphery of the lower cam, the knob is provided with angle labels, and an outer surface of the housing is provided with an angle indicator at a position corresponding to the knob.

4. The arc-shaped lock of claim 3, wherein the first sliding mechanism comprises a first top cover, a first slide bar and a first bottom cover, the first top cover and the first bottom cover are respectively fixed at an end of the first slide bar, and the first sliding mechanism is movably arranged in the housing;
the second sliding mechanism comprises a second top cover, a second slide bar and a second bottom cover, the second top cover and the second bottom cover are respectively fixed at an end of the second slide bar, and the second sliding mechanism is movably arranged in the housing; and
the positioning mechanism is used for driving the first slide bar and the second slide bar to move relative to the mounting base, making the end of the first slide bar away from or close to the first contact surface and the end of the second slide bar away from or close to the first contact surface to adjust an angle between the first mounting surface and the second mounting surface.

5. The arc-shaped lock of claim 4, wherein the first sliding mechanism further comprises a first spring, and the second sliding mechanism further comprises a second spring, the first spring is arranged between the first contact surface of the mounting base and the first top cover and/or the first bottom cover, and the first spring is used for connecting the first sliding mechanism with the upper cam without gap; and
the second spring is arranged between the first contact surface of the mounting base and the second top cover and/or the second bottom cover, and the second spring is used for connecting the second sliding mechanism with the lower cam without gap.

6. The arc-shaped lock of claim 2, wherein the limit mechanism comprises a limit block, an arc adjusting block and a third spring, the arc adjusting block is arranged between the housing and the mounting base, and the limit block is arranged between the housing and the arc adjusting block, the third spring is arranged between the mounting base and the limit block, and the third spring provides a driving force for the limit block to move in a direction of the lock bar, so that the limit block locks the lock bar.

7. The arc-shaped lock of claim 2, wherein the locking mechanism further comprises a fixing piece, and the lock bar is provided with a hollow part penetrating through the lock bar, and the length of the hollow part is larger than the width of the fixing piece, the fixing piece penetrates the hollow part and slidably connects the lock bar to the base, the base is provided with a third through hole for the lock bar to penetrate, and the lock bar is capable to move back and forth relative to the base.

8. The arc-shaped lock of claim 2, wherein the locking mechanism further comprises a handle and a fourth spring, one end of the lock bar is provided with grooves distributed at intervals, and another end of the lock bar is provided with a thread, the handle is rotationally connected with the lock bar through threads, the fourth spring is sleeved on the lock bar and arranged between the handle and the base, a fourth through hole is further arranged between the first through hole and the second through hole, and the fourth through hole is used for the lock bar to penetrate into the angle control mechanism.

9. The arc-shaped lock of claim 6, wherein the angle control mechanism further comprises a limit block control piece, the limit block control piece has an L-shaped structure, and the limit block control piece passes through the housing and is located above the limit block.

10. A splicing screen, comprising at least two LED display modules and the arc-shaped lock of claim 1, the angle control mechanism is connected with one LED display module, the locking mechanism is connected with another adjacent LED display module, and the angle control mechanism is fixedly connected with the locking mechanism.

11. A splicing screen, comprising at least two LED display modules and the arc-shaped lock of claim 2, the angle control mechanism is connected with one LED display module, the locking mechanism is connected with another adjacent LED display module, and the angle control mechanism is fixedly connected with the locking mechanism.

12. A splicing screen, comprising at least two LED display modules and the arc-shaped lock of claim 3, the angle control mechanism is connected with one LED display module, the locking mechanism is connected with another adjacent LED display module, and the angle control mechanism is fixedly connected with the locking mechanism.

13. A splicing screen, comprising at least two LED display modules and the arc-shaped lock of claim 4, the angle control mechanism is connected with one LED display module, the locking mechanism is connected with another adjacent LED display module, and the angle control mechanism is fixedly connected with the locking mechanism.

14. A splicing screen, comprising at least two LED display modules and the arc-shaped lock of claim 5, the angle control mechanism is connected with one LED display module, the locking mechanism is connected with another adjacent LED display module, and the angle control mechanism is fixedly connected with the locking mechanism.

15. A splicing screen, comprising at least two LED display modules and the arc-shaped lock of claim 6, the angle control mechanism is connected with one LED display module, the locking mechanism is connected with another adjacent LED display module, and the angle control mechanism is fixedly connected with the locking mechanism.

16. A splicing screen, comprising at least two LED display modules and the arc-shaped lock of claim 7, the angle control mechanism is connected with one LED display module, the locking mechanism is connected with another adjacent LED display module, and the angle control mechanism is fixedly connected with the locking mechanism.

17. A splicing screen, comprising at least two LED display modules and the arc-shaped lock of claim 8, the angle control mechanism is connected with one LED display module, the locking mechanism is connected with another adjacent LED display module, and the angle control mechanism is fixedly connected with the locking mechanism.

18. A splicing screen, comprising at least two LED display modules and the arc-shaped lock of claim 9, the angle control mechanism is connected with one LED display module, the locking mechanism is connected with another adjacent LED display module, and the angle control mechanism is fixedly connected with the locking mechanism.

* * * * *